(12) United States Patent
Degtyarev et al.

(10) Patent No.: US 8,912,863 B2
(45) Date of Patent: Dec. 16, 2014

(54) CATV FACE PLATE DEVICE AND METHOD WITH EXTENDED FREQUENCY RANGE

(75) Inventors: Olga Degtyarev, Lod (IL); Yehezkel Albag, Nordia (IL); Yasis Shohet, Ramat-Gan (IL); Gavriel Magnezi, Givat Shmuel (IL)

(73) Assignee: Xtend Networks Ltd., Lod (IL)

( * ) Notice: Subject to any disclaimer, the term of this patent is extended or adjusted under 35 U.S.C. 154(b) by 6 days.

(21) Appl. No.: 12/911,987

(22) Filed: Oct. 26, 2010

(65) Prior Publication Data

US 2011/0095840 A1   Apr. 28, 2011

Related U.S. Application Data

(60) Provisional application No. 61/254,885, filed on Oct. 26, 2009.

(51) Int. Cl.
*H01P 5/12* (2006.01)

(52) U.S. Cl.
USPC .......................................... 333/100; 361/641

(58) Field of Classification Search
USPC ........... 333/100, 109, 112, 127, 128, 244, 33, 333/32; 361/641, 643, 728, 730, 732, 736, 361/752, 753, 760, 796, 800, 803
See application file for complete search history.

(56) References Cited

U.S. PATENT DOCUMENTS

| | | | | |
|---|---|---|---|---|
| 3,641,464 A | * | 2/1972 | Crowhurst et al. | 333/112 |
| 5,828,272 A | * | 10/1998 | Romerein et al. | 333/100 |
| 5,892,653 A | * | 4/1999 | Nishimuta et al. | 361/643 |
| 5,990,759 A | * | 11/1999 | Matsubara | 333/109 |

\* cited by examiner

*Primary Examiner* — Stephen Jones
(74) *Attorney, Agent, or Firm* — Pearl Cohen Zedek Latzer, LLP

(57) ABSTRACT

A face plate for cable-TV networks, the face plate adapted to operate in frequencies as high as 1.8 GHz. The face plate comprising terminals, electronic circuitry, impedance matching units and a disturbances suppressor. The disturbances suppressor is designed to suppress the parasitic resonance of the transmission line that appears inside the extended operational frequency band of 1000 to 1800 MHz. The impedance matching units are adapted to match the impedance of the terminal with that of electronic circuitry.

7 Claims, 9 Drawing Sheets

CATV FACE PLATE DEVICE AND METHOD WITH EXTENDED FREQUENCY RANGE

CROSS REFERENCE TO RELATED APPLICATIONS

This Application claims the benefit of U.S. Provisional Application Ser. No. 61/254,885, filed Oct. 26, 2009, which is hereby incorporated by reference in its entirety.

BACKGROUND OF THE INVENTION

Cable TV (CATV) networks employ radio frequency (RF) cables connected via distribution elements from a central point (head end) to plurality of end points (users). Distribution elements may be tap boxes, splitters, mergers, AC power merging devices and the like. Several of these distribution devices are located in a field location (junction boxes, underground junction boxes and the like), inside installation boxes, in a way that allows easy removal of the electronic circuitry of the device, without a need to disconnect the CATV cables form the device's box. Usually these device's boxes comprise a shunt connection (transmission line connecting between input and output ports) to allow continuity of connection in the network when the electronic circuit is temporarily removed from its box, for example for maintenance. Physical features of elements in the device box may negatively affect the performance of the device. For example parasitic capacitance in the IN/OUT ports of the device, where the CATV cables are connected, may limit the higher portion of the working frequency range of the device. Similarly, parasitic capacitance of the transmission line, even when it is not connected between IN and OUT ports, may also limit the higher portion of the working frequency range of the device.

It is customary to design CATV networks so that the cables and devices' boxes will not have to be replaced unless physically/functionally damaged. Thus, improved electronics (for example with higher yield, better MTBF values and the like) may be easily installed in the CATV network by removing the existing electronic unit and plugging the improved/replacement electronic unit instead. When the existing electronic circuitry of a box is replaced with a newer one, which enables an extended range of frequencies, especially higher frequencies, the limitations for higher frequencies stemming from the physical features of the device's box, as described above, may prevent using of the extended range of frequencies, or a portion of it.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3A is a schematic partial illustration of a distribution box with its corresponding face plate attached to it, according to embodiments of the present invention;

FIG. 3B is a schematic top view illustration of a transmission line for connecting directly between input and output terminals of a distribution box and of disturbances suppressor unit, according to embodiments of the present invention;

Figure 1:
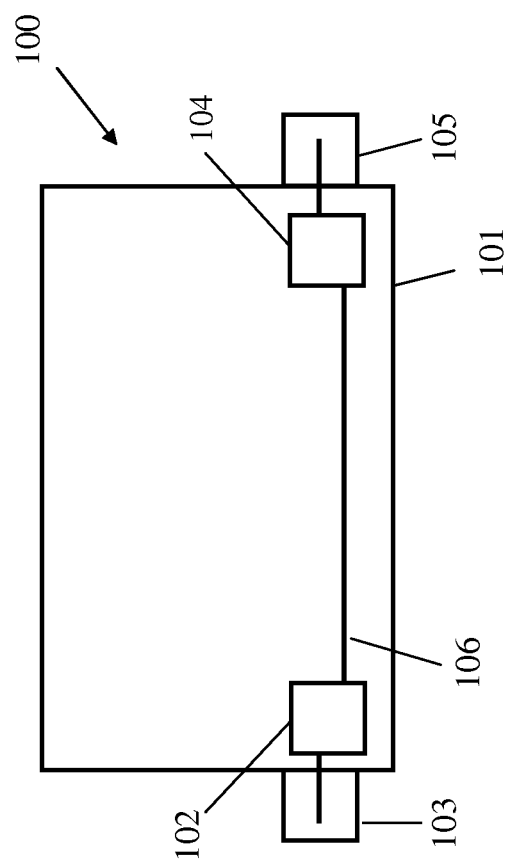
FIG. 1 is a schematic illustration of a distribution box from which the face plate was removed, as known in the art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Reference is made to FIG. 1, which is schematic illustration of a distribution box 100 from which the face plate was removed, as known in the art. Box 100 comprises a housing 101, external terminals 103, 105 to enable connection to CATV coaxial cables, internal terminals 102, 104 associated with external terminals 103, 105 respectively, to enable connection to a face plate (not shown) with electronic circuitry and a transmission line 106 to enable continuity of the line between external terminals 103 and 105 when the electronic circuitry is removed, for example for maintenance.

Figure 2:
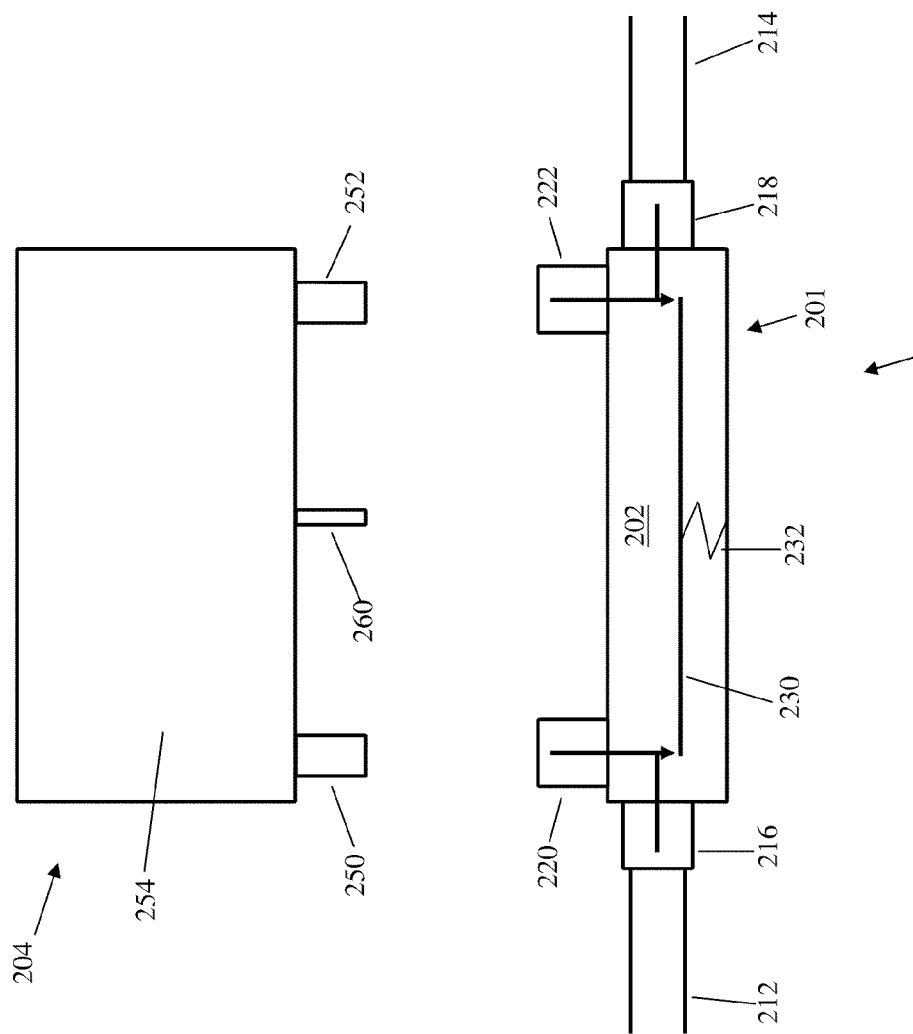
FIG. 2 is a schematic illustration of an assembly of a distribution box and a corresponding face plate unit as known in the art.

Reference is made to FIG. 2, which is schematic illustration of an assembly 200 of distribution box 202 and a corresponding face plate unit 204 as known in the art. Distribution box 202 comprises typically a housing 201, external terminals 216, 218 to enable connection to CATV coaxial cables 212, 214 respectively, internal terminals 220, 222 associated with external terminals 216, 218 respectively, to enable connection to face plate 204 and a transmission line 230 to enable continuity of the line between external terminals 216, 218 when the electronic circuitry is removed, for example for maintenance. Transmission line 230 is adapted to connect between terminals 216 and 218 when face plate 204 is removed. When face plate 204 is installed onto box 202 transmission line 230 is disconnected from terminals 216 and 218. Typically the connection and disconnection of transmission line 230 is according to make-before-break scheme, in order to ensure continuity of connection between terminals 216 and 218 at all times. Typically the activation of transmission line 230 to connect between terminals 216 and 218 is done by extending unit 232, such as a spring. The activation of transmission line to disconnect is typically done mechanically by the insertion of faceplate 204 into its place in box 202.

Face plate 204 comprises electronic circuitry 254 of assembly 200 connected between terminals 250 and 252 which are adapted to connect to internal terminals 220, 222 respectively, to enable providing the functionalities of assembly 200. Face plate 204 further comprises protrusion 260 adapted to push transmission line 230 away from terminals 216 and 218 in order to disconnect the direct connection between them upon insertion of face plate 204 and thus enable proper operation of face plate 204.

Known assemblies such as assembly 200 of distribution box 202 and face plate unit 204 are designed to operate in the range of frequencies of not higher than 1 GHz. Therefore RF signal of higher frequencies will suffer of losses and return losses, especially due to the incompatibility of the design of terminals 216 and 218 to operate in frequencies higher than 1 GHz and the presence of transmission line 230 close to these terminals, which induce parasitic capacitance and/or inductance in frequencies higher than 1 GHz when it is disconnected from terminals 216 and 218.

Figure 3:
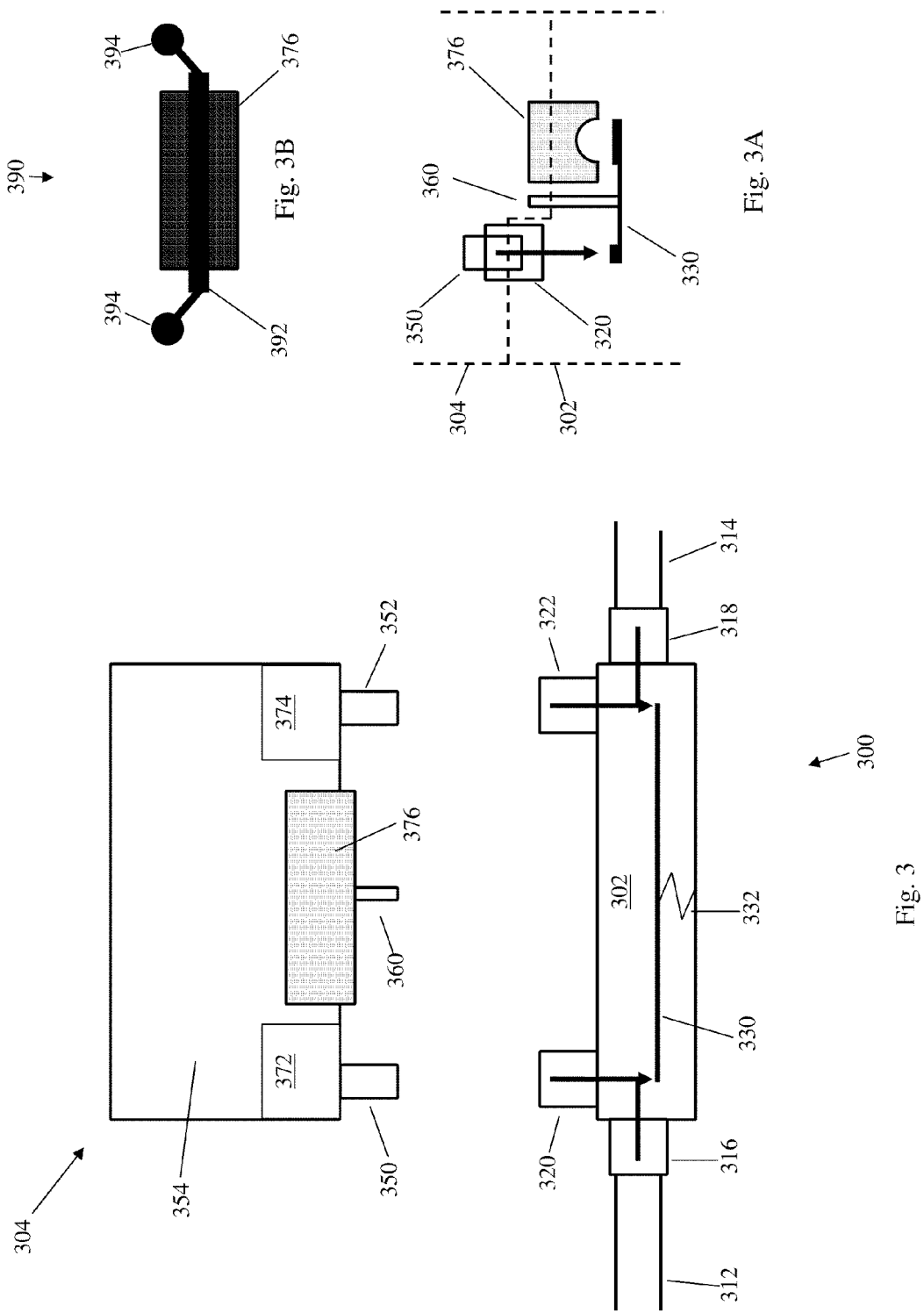
FIG. 3 is a schematic illustration of a distribution assembly comprising a box and a corresponding face plate unit according to embodiments of the present invention.

Attention is made to FIG. 3, which is a schematic illustration of a distribution assembly 300 comprising box 302 and corresponding face plate unit 304 according to embodiments of the present invention. While box 302 is substantially the same as box 202 as is known in the art, face plate unit 304 is adapted to compensate for disadvantages of box 302, so as to enable assembly 300 to operate in frequencies as high as 1.8 GHz and even higher. Distribution box 302 comprises typically external terminals 316, 318 to enable connection to CATV coaxial cables 312, 314 respectively, internal terminals 320, 322 associated with external terminals 316, 318 respectively, to enable connection to face plate 304 and a transmission line 330 to enable continuity of the line between external terminals 316, 318 when the electronic circuitry is removed, for example for maintenance. Extending unit 332 is substantially the same as extending unit 232. Face plate 304 comprises terminals 350 and 352, electronic circuitry 354, impedance matching units 372 and 374 and disturbances suppressor 376. Electronic circuitry 354 may have substantially similar functionalities as electronic circuitry 254 of the prior art, only adapted to operate in frequencies as high as 1.8 GHz and even higher. The design of face plate 304 according to embodiments of the present invention utilizes the same physical dimensions as a face plate 204 of the prior art, in order to allow inserting it into the respective box 302. The design of face plate 304 according to embodiments of the present invention also presents in terminals 350 and 352 electrical characteristics similar to those presented by face plate 204 of the prior art, yet across a wider range of frequencies, substantially from zero to 1.8 GHz between zero to −3 db attenuation. This is made possible by the introducing of impedance matching units 372 and 374 as an addition to a legacy face plate of the operational frequency range of not higher than 1 GHz and further by the introduction of disturbances suppressor unit 376. Impedance matching units 372 are adapted to match the impedance of terminals 350 and 352 with that of electronic circuitry 354. Disturbances suppressor unit 376 is made of a substantially "U" shape ferrite material body and its shape is designed so as to suppress the parasitic resonance of transmission line 330 that appears inside the extended new operational frequency band 1000 to 1800 MHz. The reason for this parasitic resonance is the fact when such a transmission line left open when deactivated (when the face plate inserted) the open ended line behaves in the operational range of frequencies as a series of inductors with capacitors between them connected to the ground. Additionally, some coupling between the open ends of transmission line 330 to the respective terminals 320, 322 is still available due to small capacitance between these ends, even though these ends are disconnected.

Attention is made now to FIG. 3A, which is a schematic partial illustration of distribution box 302 with its corresponding face plate 304 attached to it, according to embodiments of the present invention. When face plate 304 is inserted to its place in box 302 terminal 350 is connected to terminal 320 (and, not shown, terminal 352 to terminal 322), protrusion 360 pushes transmission line 330 away from terminal 320 (and, not shown, from terminal 322) and disturbances suppressor 376 is placed next to transmission line 330. Attention is made now also to FIG. 3B, which is a schematic top view illustration of transmission line 390 for connecting directly between input and output terminals 320 and 322 of distribution box 302 and of disturbances suppressor unit 376, according to embodiments of the present invention. Transmission line 390 may comprise a main body 392 connected to two end terminals 394. As seen in the drawing disturbances suppressor unit 376 (drawn here as partially transparent) may be placed adjacent to and substantially covering main body 392 of transmission line 390, to provide, in the respective range of frequencies of 1000 to 1800 MHz or higher, suppression of the parasitic capacitance/inductance. The effect of disturbances suppressor unit 376 on the parasitic resonance of transmission line 330 may be explained in at least one of the following explanations. First, the parasitic resonance frequency of transmission line 330 when disconnected results from the series of inductors and parallel capacitors being its equivalent circuit. When disturbances suppressor unit 376 is placed adjacent to transmission line 330, it increases the value of both the inductors and the capacitors and so lower the frequency of the parasitic resonance to a value that has a much smaller effect on the over-all performance of the distribution box. Second, the ferrite body of disturbances suppressor unit 376 lowers the Q figure of equivalent L-C circuit of transmission line 330 and thus lowers the amplitude of this resonance.

Figure 4:
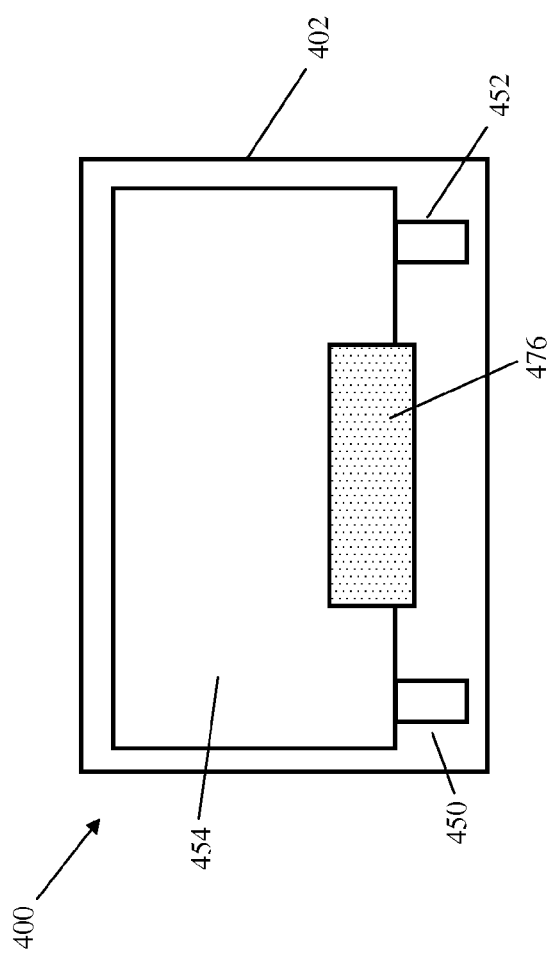
FIG. 4 is a schematic illustration of an exemplary face plate for a distribution box according to embodiments of the present invention.

Attention is made now to FIG. 4, which is schematic illustration of an exemplary face plate unit 400 for a distribution box according to embodiments of the present invention. Face plate unit 400 may comprise face plate body 402, face plate electronic circuitry 454, face plate terminals 450 and 452 and disturbances suppressor unit 476.

Figure 5:
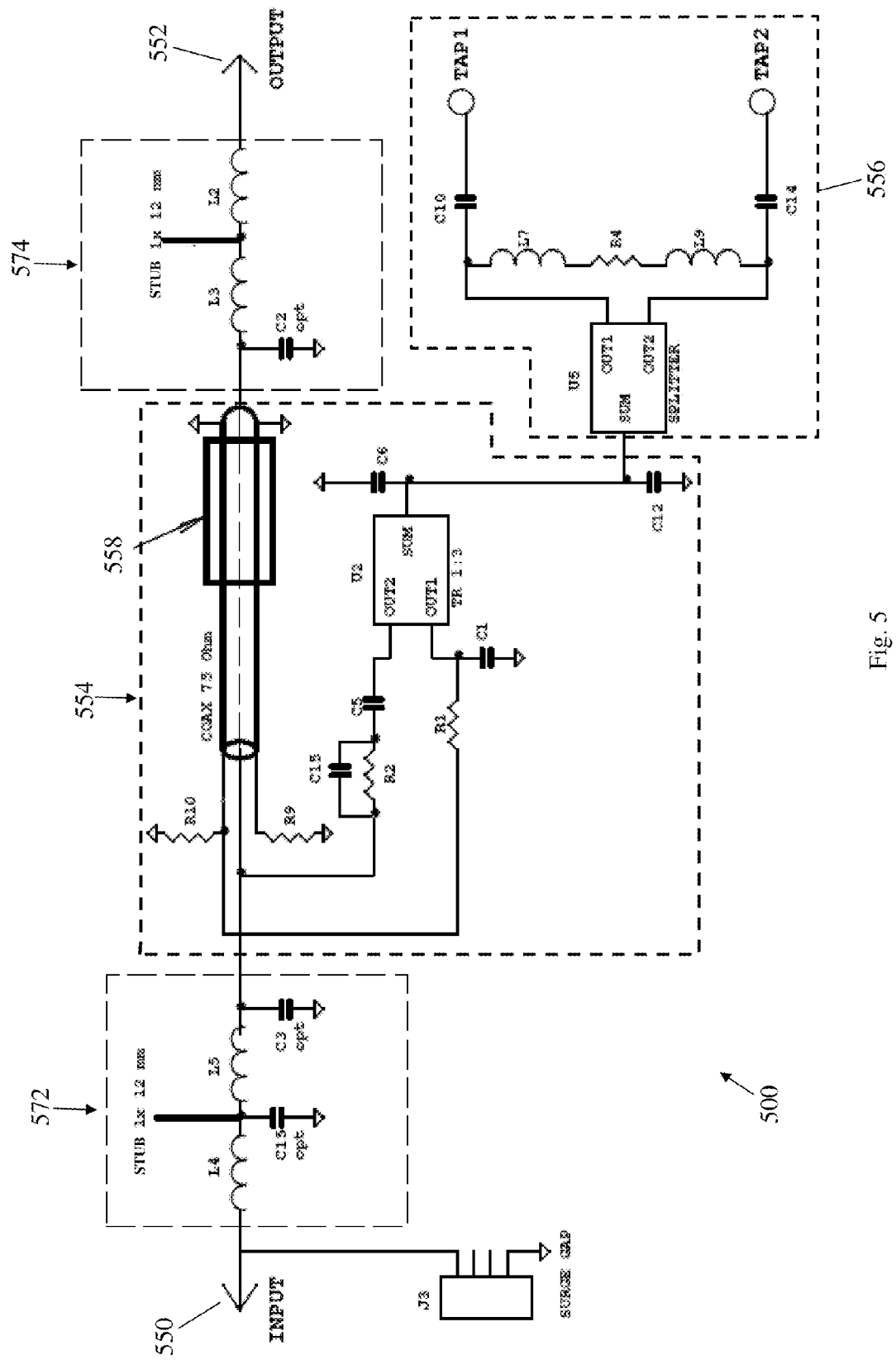
FIG. 5 is a schematic electrical diagram of a distribution box with two taps according to embodiments of the present invention.

Attention is made now to FIG. 5, which is a schematic electrical diagram 500 of a distribution box with two taps according to embodiments of the present invention. Diagram 500 may comprise a first impedance matching section 572 to match the impedance of terminal 550 with that of main section 554; a second impedance matching unit 574, to match the impedance of terminal 552 with that of main section 554; main section 554 may comprise electronic circuitry adapted to forward downstream RF signal from terminal 550 via unit 572 to terminal 552 via unit 574 and to forward upstream RF signal from terminal 552 via unit 574 to terminal 550 via unit 572 and to provide RF signals to users via TAP 1 and TAP 2 terminals, via user distribution section unit 556. Main section 554 may be embodied according to the description in co-pending U.S. application Ser. No. 12/566,812, filed on Sep. 25, 2009 and entitled "Chockless Power Coupler" for the same applicant. According to other embodiments of the present invention main section 554 may be embodied as known in the art. While main section 554 and user distribution section 556 may be substantially the same as their corresponding sections in a legacy face plate unit, impedance matching sections are added, according to embodiments of the present invention in order to allow substantially flat response of electrical circuitry depicted in diagram 500 in the extended frequency range from substantially zero to over 1.8 GHz. Impedance matching sections 572 and 574 may be designed as L-C networks. Matching section 572 may employ a inductors (L)-capacitors (C) network (L-C network) comprising inductors L4 and L5 in series to the RF signal and capacitors C15 and C3 connecting to the ground line. Additionally stub 1 is formed to provide additional capacitance reactivity in the operational range of frequencies, having for example the dimensions of 1×12 mm in a distance of 1.6 mm from a parallel ground layer. Matching section 574 may employ a L-C network comprising L3 and L2 in series to the RF signal flowing to terminal 552 and capacitor C2 connected to the ground. Additionally stub 2 is formed to provide additional capacitance reactivity in the operational range of frequencies, having for example the dimensions of 1×12 mm in a distance of 1.6 mm from a parallel ground layer.

Figure 6A:
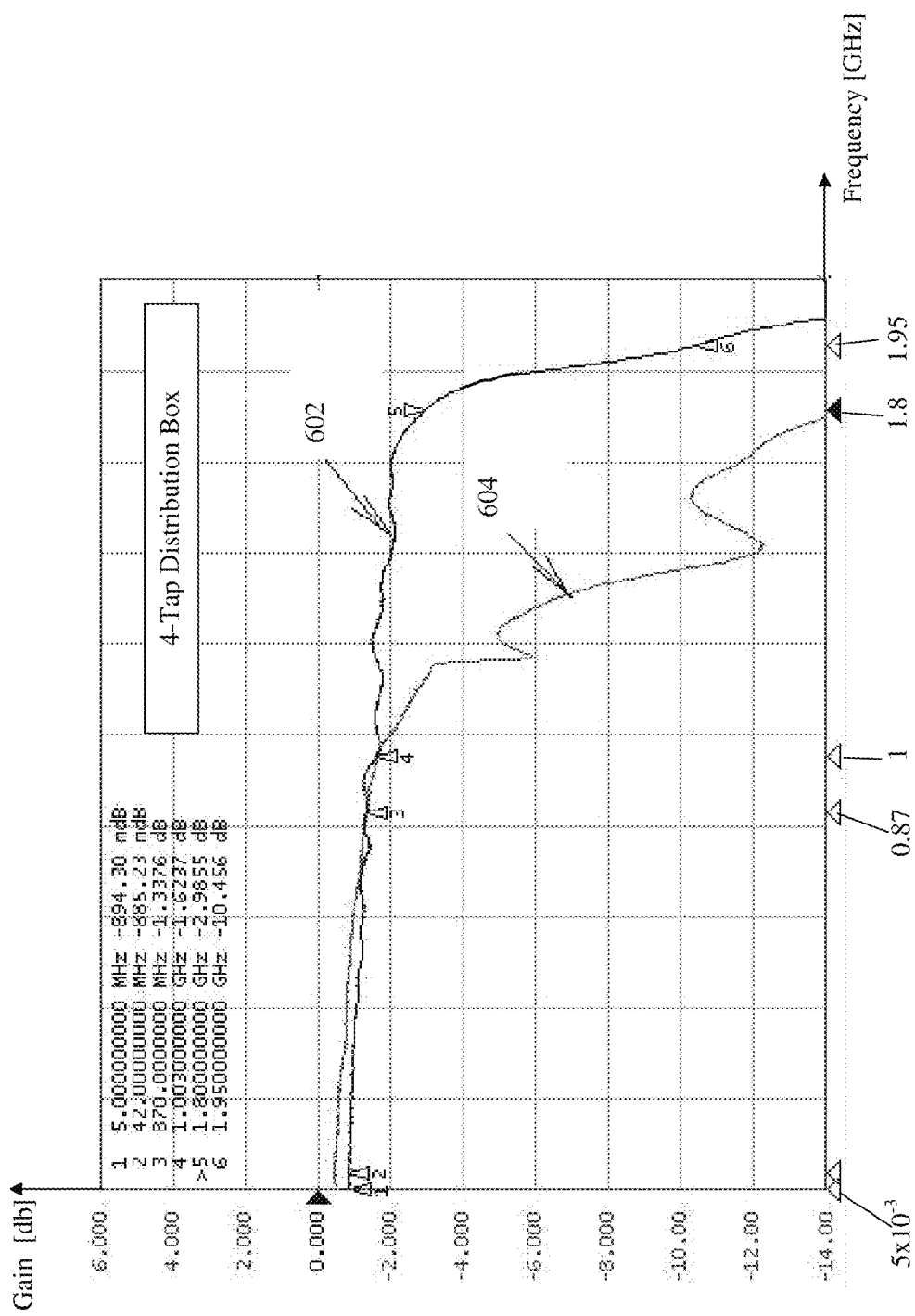
FIGS. 6A-6D are comparison performance graphs comparing the performance of distribution devices according to embodiments of the present invention with performance of corresponding distribution devices according to the prior art.
Figure 6B:
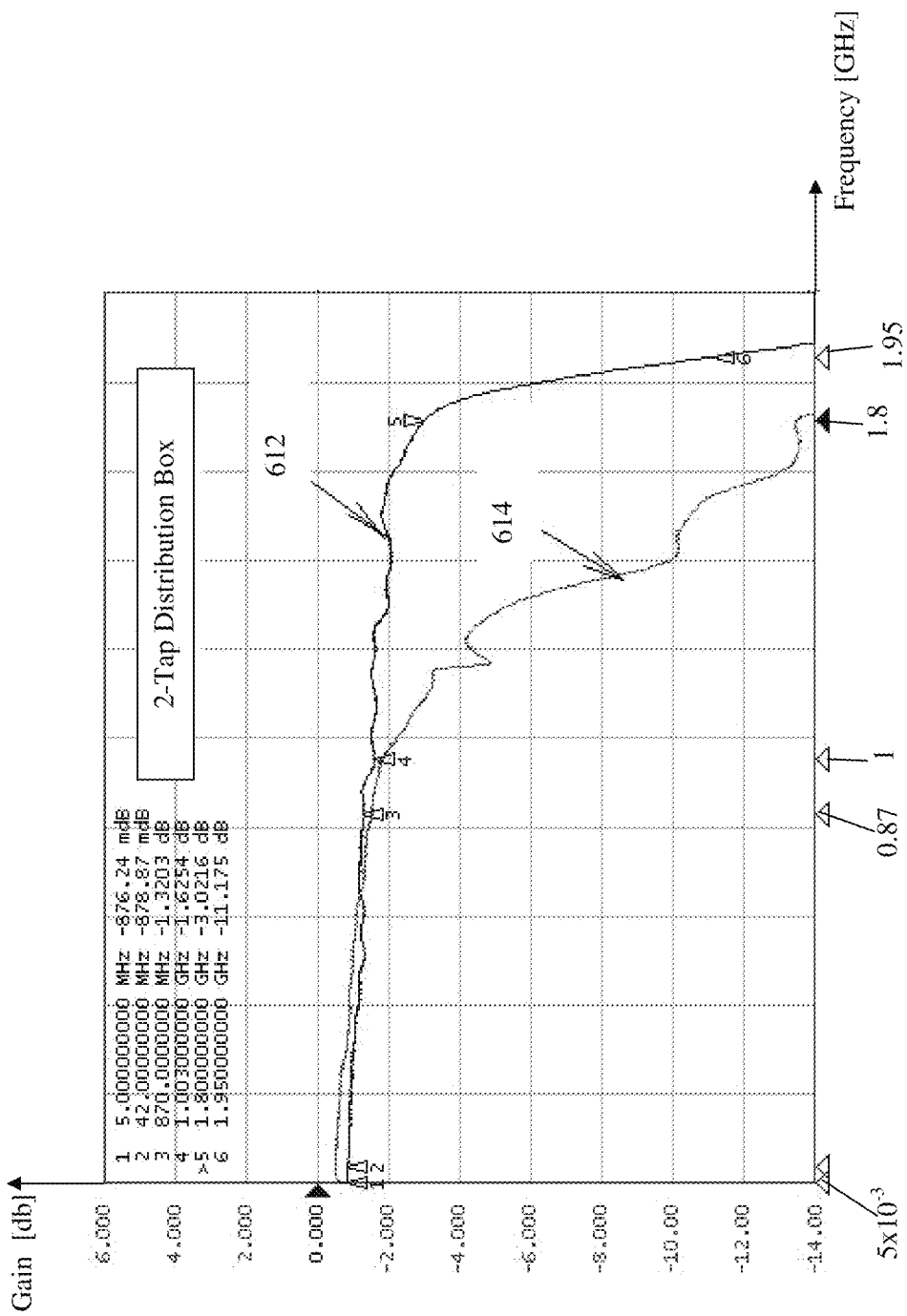
Figure 6C:
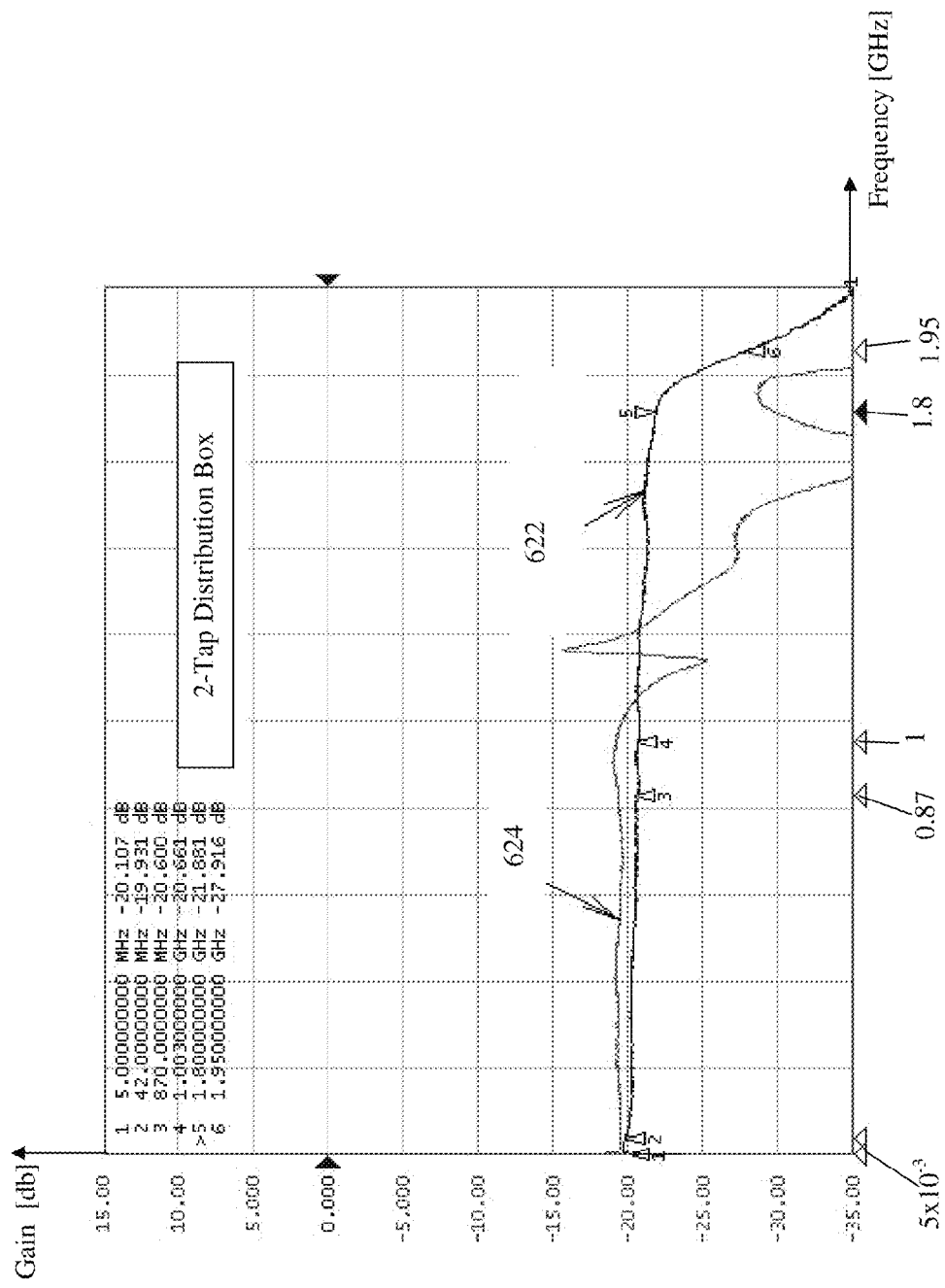
Figure 6D:
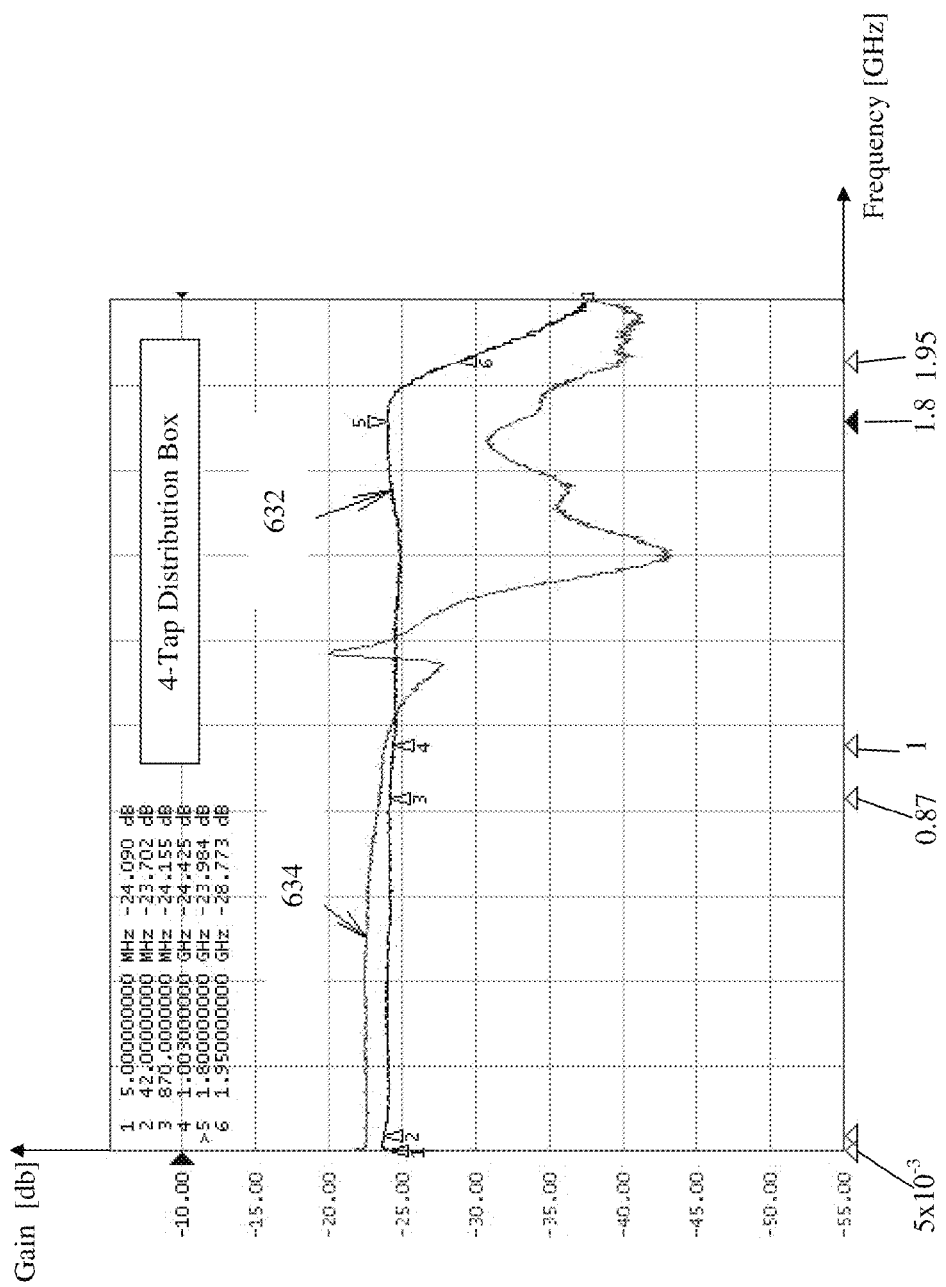

Attention is made now to FIGS. 6A-6D, presenting the plots of frequency response of various face plates according to embodiments of the present invention. FIG. 6A compares plot 602 of performance of transmission over the main line (in to out) of a 4 way tap distribution box coupled with attenuation of −23 db to the main line according to embodiments of the present invention with plot 604 of a corresponding prior art 4 way tap distribution box in the frequency range of 5 MHz to 1.95 GHz. FIG. 6B compares plot 612 of performance of the transmission over the main line (in to out) of a 2 way tap distribution box coupled with attenuation of −20 db to the main line according to embodiments of the present invention with plot 614 of a corresponding prior art 2 way tap distribution box in the frequency range of 5 MHz to 1.95 GHz. FIG. 6C compares plot 622 of performance of a transmission from a main line to a tap port of a 2 tap distribution box according to embodiments of the present invention with plot 624 of a corresponding prior art legacy distribution box in the frequency range of 5 MHz to 1.95 GHz. FIG. 6D compares plot 632 of performance the transmission from main line to a tap in a 4 tap distribution box of a according to embodiments of the present invention with plot 634 of a corresponding prior art distribution box in the frequency range of 5 MHz to 1.95 GHz.

From all four examples of embodiments of the present invention, as compared to corresponding configurations of the prior art it is clearly shown that while the prior art embodiments completely fail to operate above 1 GHz, the embodiments of the present invention perform in the extended range of up to 1.8 GHz and above.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A face plate comprising:
    two terminals;
    electronic circuitry;
    two impedance matching units, each connected to one of said terminals and to said electronic circuitry, said impedance matching units to match the impedance of said terminals with that of said electronic circuitry; and
    a disturbances suppressor mounted on said face plate, said disturbances suppressor to suppress parasitic resonance of a transmission line mounted on a distribution box,
    wherein said face plate adopted to be installed onto said distribution box.

2. The face plate of claim 1, wherein said disturbances suppressor to suppress parasitic resonance of a transmission line mounted on a distribution box, said parasitic resonance appears in frequency band of 1000 to 1800 MHz.

3. The face plate of claim 1, wherein said disturbances suppressor is a "U" shape ferrite material body.

4. The face plate of claim 3, wherein said transmission line comprises a main body and wherein said disturbances suppressor is placed adjacent to and covering said main body.

5. The face plate of claim 1, wherein said impedance matching units are L-C networks.

6. The face plate of claim 5, wherein said L-C networks comprise:
    two inductors in series to the RF signal;
    at least one capacitor connecting to a ground line; and
    a stub to provide additional capacitance reactivity.

7. The face plate of claim 6, wherein said stub dimensions are 1×12 mm and wherein said stub is located in a distance of 1.6 mm from a parallel ground layer.

\* \* \* \* \*